United States Patent
Sugimori et al.

(10) Patent No.: US 9,406,657 B2
(45) Date of Patent: Aug. 2, 2016

(54) SEMICONDUCTOR LIGHT-EMITTING DEVICE

(71) Applicant: KOITO MANUFACTURING CO., LTD., Tokyo (JP)

(72) Inventors: Shogo Sugimori, Shizuoka (JP); Osamu Kuboyama, Shizuoka (JP); Hisayoshi Daicho, Shizuoka (JP)

(73) Assignee: KOITO MANUFACTURING CO., LTD., Tokyo (JP)

(*) Notice: Subject to any disclaimer, the term of this patent is extended or adjusted under 35 U.S.C. 154(b) by 0 days.

(21) Appl. No.: 14/377,111

(22) PCT Filed: Jan. 22, 2013

(86) PCT No.: PCT/JP2013/051174
§ 371 (c)(1),
(2) Date: Aug. 6, 2014

(87) PCT Pub. No.: WO2013/118571
PCT Pub. Date: Aug. 15, 2013

(65) Prior Publication Data
US 2015/0048391 A1    Feb. 19, 2015

(30) Foreign Application Priority Data
Feb. 6, 2012    (JP) .................................. 2012-023177

(51) Int. Cl.
*H01L 33/62*    (2010.01)
*H01L 25/13*    (2006.01)
(Continued)

(52) U.S. Cl.
CPC . *H01L 25/13* (2013.01); *F21K 9/00* (2013.01); *H01L 33/505* (2013.01);
(Continued)

(58) Field of Classification Search
None
See application file for complete search history.

(56) References Cited

U.S. PATENT DOCUMENTS

2010/0102340 A1*  4/2010  Ooya et al. ............. 257/98
2011/0073899 A1   3/2011  Inoue et al.
(Continued)

FOREIGN PATENT DOCUMENTS

JP    7-42150 U    7/1995
JP    8-287719 A   11/1996
(Continued)

OTHER PUBLICATIONS

International Search Report for corresponding International Application No. PCT/JP2013/051174, mailed Feb. 26, 2013 (5 pages).
(Continued)

*Primary Examiner* — Kimberly Rizkallah
*Assistant Examiner* — Bo Bin Jang
(74) *Attorney, Agent, or Firm* — Osha Liang LLP

(57) ABSTRACT

A semiconductor light-emitting device has a substrate, one or more semiconductor light-emitting elements provided on the substrate, and that emit light having a peak wavelength in a 380 nm to 480 nm wavelength region, and a molded member covering the semiconductor light-emitting element, and containing a phosphor that emits visible light by being excited by the emitted light from the semiconductor light-emitting element. The molded member is formed so that index $A=H/(s/n)$ satisfies $0.3 \leq A \leq 6$, where H is the height [mm] of the molded member from the substrate, s is the square root [mm] of the contact area between the substrate and the molded member, and n is the number of the semiconductor light-emitting elements covered with the molded member.

17 Claims, 4 Drawing Sheets

(51) Int. Cl.
*H01L 33/50* (2010.01)
*H01L 33/58* (2010.01)
*F21K 99/00* (2016.01)
H01L 25/075 (2006.01)
H01L 33/54 (2010.01)

(52) U.S. Cl.
CPC ............ *H01L 33/507* (2013.01); *H01L 33/58* (2013.01); *H01L 25/0753* (2013.01); *H01L 33/54* (2013.01); *H01L 2924/0002* (2013.01)

(56) References Cited

U.S. PATENT DOCUMENTS

2011/0116005 A1* 5/2011 Sakai et al. .................... 349/61
2012/0134132 A1* 5/2012 Park .......................... F21K 9/56
362/84

FOREIGN PATENT DOCUMENTS

| | | |
|---|---|---|
| JP | 2001-148514 A | 5/2001 |
| JP | 2002314142 A | 10/2002 |
| JP | 2006083219 A | 3/2006 |
| JP | 2006156738 A | 6/2006 |
| JP | 2007101932 A | 4/2007 |
| JP | 2008163259 A | 7/2008 |
| JP | 2010-161420 A | 7/2010 |
| JP | 2010-165996 A | 7/2010 |
| JP | 2010177163 A | 8/2010 |
| JP | 2011-077213 A | 4/2011 |
| JP | 2011-199054 A | 10/2011 |
| JP | 2011-243963 A | 12/2011 |
| WO | 2009/145259 A1 | 12/2009 |

OTHER PUBLICATIONS

Written Opinion for corresponding International Application No. PCT/JP2013/051174, mailed Feb. 26, 2013 (3 pages).

Office Action issued in corresponding Japanese Application No. 2012-023177, mailed on Aug. 4, 2015 (9 pages).

Office Action issued in corresponding Japanese Application No. 2012-023177, mailed on Apr. 15, 2016 (14 pages).

* cited by examiner

SEMICONDUCTOR LIGHT-EMITTING DEVICE

CROSS-REFERENCE TO RELATED APPLICATIONS

This application is a national stage application of PCT Application No. PCT/JP2013/051174, filed Jan. 22, 2013, and claims foreign priority to Japanese Patent Application No. 2012-023177, filed Feb. 6, 2012.

TECHNICAL FIELD

The present invention relates to a semiconductor light-emitting device that includes a semiconductor light-emitting element.

BACKGROUND ART

A semiconductor light-emitting device for emitting white light is known that includes a blue emitting element for emitting blue light, and a binder that contains phosphors for emitting light of the green to red wavelength region by absorbing the blue light (see Patent Document 1). Such a semiconductor light-emitting device produces white light by mixing the emergent blue light from the blue emitting element with the light of the green to red wavelength region emitted by the phosphors.

There has been a rapid expansion of lighting fixtures that use a light source realized by the semiconductor light-emitting device of the foregoing scheme. This comes with a growing demand for widening the illumination range of lighting fixtures that use the semiconductor light-emitting device as the light source, in addition to improving brightness and efficiency. The demand for reducing the directivity and increasing the illumination range is particularly high in lighting fixtures used as alternatives for room illuminations and incandescent lamps (light bulbs).

PRIOR ART DOCUMENT

Patent Document

Patent Document 1: JP-A-2011-199054

SUMMARY OF THE INVENTION

The existing semiconductor light-emitting elements are heavily directional. This issue has been addressed by using a semiconductor light-emitting device, that includes the semiconductor light-emitting element, in combination with various other optical members such as lenses, reflecting mirrors, and diffusion plates to realize a lighting fixture of light distribution characteristics with a wide illumination range.

A problem of using a semiconductor light-emitting device with other optical members, however, is that each additional optical member installed in the lighting fixture adds to the size of the lighting fixture, lowers efficiency, and increases the manufacturing cost.

It is accordingly an object of the present invention to provide a semiconductor light-emitting device that can illuminate a wide range by itself.

Means for Solving the Problem

In order to achieve the foregoing object, the present invention provides a semiconductor light-emitting device that includes:

a substrate;

one or more semiconductor light-emitting elements provided on the substrate, and that emit light having a peak wavelength in a 380 nm to 480 nm wavelength region; and a molded member covering the semiconductor light-emitting element, and containing a phosphor that emits visible light by being excited by the emitted light from the semiconductor light-emitting element, wherein the molded member is formed so that index $A=H/(s/n)$ satisfies $0.3 \leq A \leq 6$, where H is the height [mm] of the molded member from the substrate, s is the square root [mm] of the contact area between the substrate and the molded member, and n is the number of the semiconductor light-emitting elements covered with the molded member.

In the semiconductor light-emitting device according to the present invention, the molded member may be formed into a shape that is largest along the thickness in a main emission direction of the semiconductor light-emitting element.

In the semiconductor light-emitting device according to the present invention, more than one of the semiconductor light-emitting elements may be disposed on the substrate, and the molded member may be integrally provided so as to be continuous between the semiconductor light-emitting elements.

In the semiconductor light-emitting device according to the present invention, it is preferable that the molded member be formed so as to satisfy the index A of $0.9 \leq A \leq 1.7$.

In the semiconductor light-emitting device according to the present invention, the volume concentration of the phosphor contained in the molded member may be 0.005 vol % to 10 vol %.

The binder may contain fine particles of materials such as silicon dioxide, titanium dioxide, aluminum oxide, and barium titanate as a light diffusing agent and a thixotropic agent. The light diffusing agent and the thixotropic agent are not limited to these substances.

Advantage of the Invention

A semiconductor light-emitting device according to the present invention includes a molded member that satisfies the index $A=H/(s/n)$ of $0.3 \leq A \leq 6$, and can illuminate a wide range by itself. Further, a lighting fixture of a wide illumination range can be realized with the light-emitting device of the present invention without necessitating other optical members, or without greatly increasing the number of such optical members. This makes it possible to inexpensively provide a small lighting fixture having high light efficiency.

DESCRIPTION OF EMBODIMENTS

A semiconductor light-emitting device 1 according to an embodiment of the present invention (hereinafter, simply "light-emitting device 1") is described below with reference to FIG. 1A and FIG. 1B.

Figure 1A:
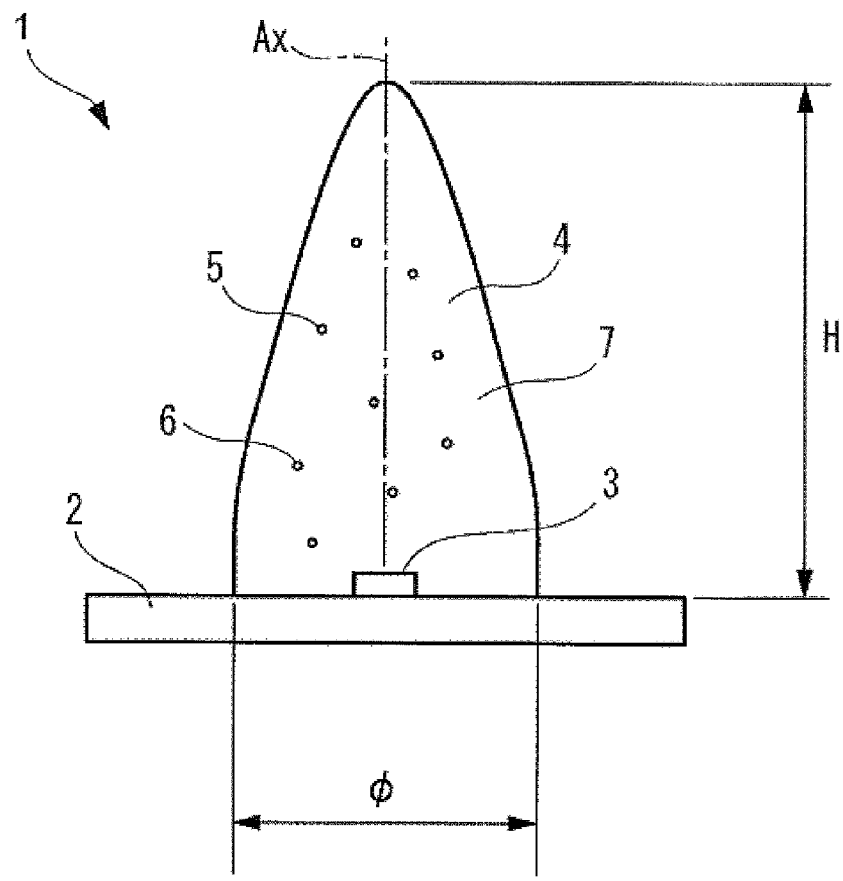
FIG. 1A and FIG. 1B are diagrams illustrating a semiconductor light-emitting device according to an embodiment of the present invention.
Figure 1B:
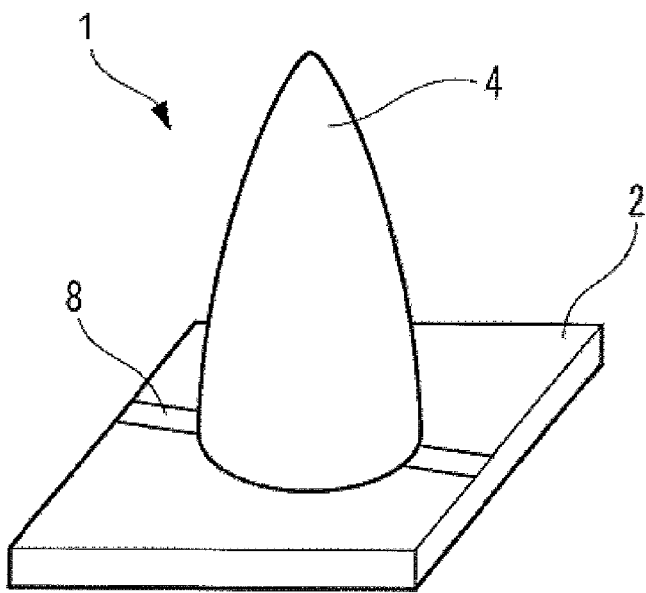

FIG. 1A and FIG. 1B are diagrams illustrating the light-emitting device 1 of the embodiment of the present invention, in which FIG. 1A is a cross sectional view of the light-emitting device 1, and FIG. 1B is a perspective view of the light-emitting device 1. As illustrated in FIG. 1A and FIG. 1B, the light-emitting device 1 includes a substrate 2, a semiconductor light-emitting element 3 solely provided on the substrate 2, and a molded member 4 covering the semiconductor light-emitting element 3.

The substrate 2 may be formed, for example, by using ceramic materials such as aluminum nitride, alumina, mullite, and glass ceramic, and glass epoxy resin. In the present embodiment, the substrate 2 is formed as a rectangular plate member.

The semiconductor light-emitting element 3 is a semiconductor light-emitting element capable of emitting light that has a peak wavelength in a 380 nm to 480 nm wavelength region. The semiconductor light-emitting element 3 may be realized by an LED (Light-emitting Diode) or an LD (Laser Diode) that emits light having a peak wavelength in a 380 nm to 480 nm wavelength region. In the present embodiment, a GaN LED chip that emits light having a peak wavelength at 405 nm is used as the semiconductor light-emitting element 3. The semiconductor light-emitting element 3 is electrically connected to an electrode 8 formed on the substrate 2. The semiconductor light-emitting element 3 emits highly directional light in the direction of optical axis Ax.

The molded member 4 is formed so as to entirely cover the semiconductor light-emitting element 3. The molded member 4 is formed by including a first phosphor 5 and a second phosphor 6 (phosphors), and a binder 7 in which the first phosphor 5 and the second phosphor 6 are contained.

The first phosphor 5 absorbs the emitted light from the semiconductor light-emitting element 3, and emits yellow visible light having a dominant wavelength of 564 nm to 582 nm. The first phosphor 5 absorbs hardly any visible light of wavelengths at and above 450 nm. In the present embodiment, the first phosphor 5 is a phosphor represented by $SiO_2 \cdot 1.0(Ca_{0.54}, Sr_{0.36}, Eu_{0.1})O \cdot 0.17SrCl_2$. $SiO_2$ is added in excess to the first phosphor 5 to generate cristobalite in the first phosphor 5.

The second phosphor 6 absorbs the emitted light from the semiconductor light-emitting element 3, and emits blue visible light having a dominant wavelength of 440 nm to 470 nm. In the present embodiment, the second phosphor 6 is a phosphor represented by $(Ca_{4.67}Mg_{0.5})(PO_4)_3Cl:Eu_{0.08}$.

Preferably, the first phosphor 5 and the second phosphor 6 are contained in 0.005 vol % to 10 vol % in terms of a volume concentration with respect to the molded member 4. When the contents of the first phosphor 5 and the second phosphor 6 in the molded member 4 are less than 0.005 vol %, the phosphor contents will be deficient, and the light-emitting device 1 fails to sufficiently emit light. Coupling-out efficiency suffers with contents above 10 vol %.

The binder 7 uses a light resistant material that has a transmittance of 90% or more for the emitted light from the semiconductor light-emitting element 3, and for the visible light emitted from the first phosphor 5 and the second phosphor 6. The binder 7 used in the present embodiment is a dimethyl silicone resin (JCR6126 available from Dow Corning Toray Co., Ltd.). The binder 7 may be, for example, a fluororesin, sol-gel glass, an acrylic resin, an inorganic binder, or a glass material. The binder 7 may also contain fine particles of materials such as silicon dioxide, titanium dioxide, aluminum oxide, and barium titanate as a light diffusing agent and a thixotropic agent.

As described above, the light-emitting device 1 according to the present embodiment uses the semiconductor light-emitting element 3 that emits light invisible to human eye. The light from the semiconductor light-emitting element 3 is absorbed by the first phosphor 5 and the second phosphor 6 contained in the molded member 4, and the blue light and the yellow light emitted by the first phosphor 5 and the second phosphor 6 are mixed to produce externally emitted white light. There accordingly will be no color irregularities even when the thickness of the molded member 4 from the semiconductor light-emitting element 3 to the outer surface of the molded member 4 is not uniform. This makes it possible to obtain a light-emitting device that can emit white light without producing color irregularities even when the molded member 4 has a shape of varying thicknesses.

As illustrated in FIG. 1A and FIG. 1B, the molded member 4 formed in the light-emitting device 1 according to the present embodiment erects upright on the substrate 2. The molded member 4 is columnar in shape in the bottom portion, and substantially conical in the upper portion. The axis of the molded member 4 coincides with the optical axis Ax of the semiconductor light-emitting element 3. The molded member 4 can be formed, for example, by potting the binder 7 on the substrate 2 in a liquid form with the first phosphor 5 and the second phosphor 6.

The molded member 4 is formed into a shape that has the largest dimension (height dimension H) in the direction of the optical axis Ax of the semiconductor light-emitting element 3. Specifically, the molded member 4 has a form of a circular cone with a height H of 6 mm, and a diameter φ of 11.2 mm on the surface in contact with the substrate 2.

As described above, the semiconductor light-emitting element 3 emits highly directional light in the optical axis Ax direction. Accordingly, a high concentration of the emitted light from the semiconductor light-emitting element 3 collides multiple times with the first phosphor 5 and the second phosphor 6 in the vicinity of the optical axis Ax in the molded member 4 before emerging from the molded member 4. Specifically, because the molded member 4 has a large thickness over the region where the light from the semiconductor light-emitting element 3 concentrates, the light conversion efficiency can increase, and the light-emitting device 1 can produce bright light.

The circular cone shape of the molded member 4 has a small curvature at the apex that directly lies on the optical axis Ax of the semiconductor light-emitting element 3, and a large curvature on the side surface away from the optical axis Ax of the semiconductor light-emitting element 3. The visible light from the first phosphor 5 and the second phosphor 6 also concentrates in the vicinity of the optical axis Ax of the semiconductor light-emitting element 3 where the emitted light from the semiconductor light-emitting element 3 concentrates. The white light produced in high concentration in the vicinity of the optical axis Ax is refracted in the vicinity of the small curvature apex of the molded member 4, and diffuses over a wide range. The circular cone shape in the upper portion of the molded member 4, together with the added lens function of the molded member 4, makes it possible to emit white light over a wide range with a uniform illuminance.

The white light illuminance can be set to a wide range of uniformity values by using index A. Index A is a dimensionless number represented by index $A=H/(s/n)$, where H is the height [mm] of the molded member 4 from the substrate 2, s is the square root [mm] of the contact area between the substrate 2 and the molded member 4, and n is the number of the semiconductor light-emitting elements 3 covered with the molded member 4. The light-emitting device 1 can illuminate a wide area with a uniform illuminance when the molded member 4 is formed so as to satisfy $0.3 \leq A \leq 6$.

When the height H of the molded member 4 is 6 [mm], and the diameter φ of the circle in contact with the substrate 2 is 11.2 [mm], the square root s of the contact area between the substrate 2 and the molded member 4 becomes 9.9 [mm]. In the present embodiment, index $A=6/(9.9/1)=0.61$ because the semiconductor light-emitting element 3 is solely mounted on the substrate 2 (n=1).

Figure 2:
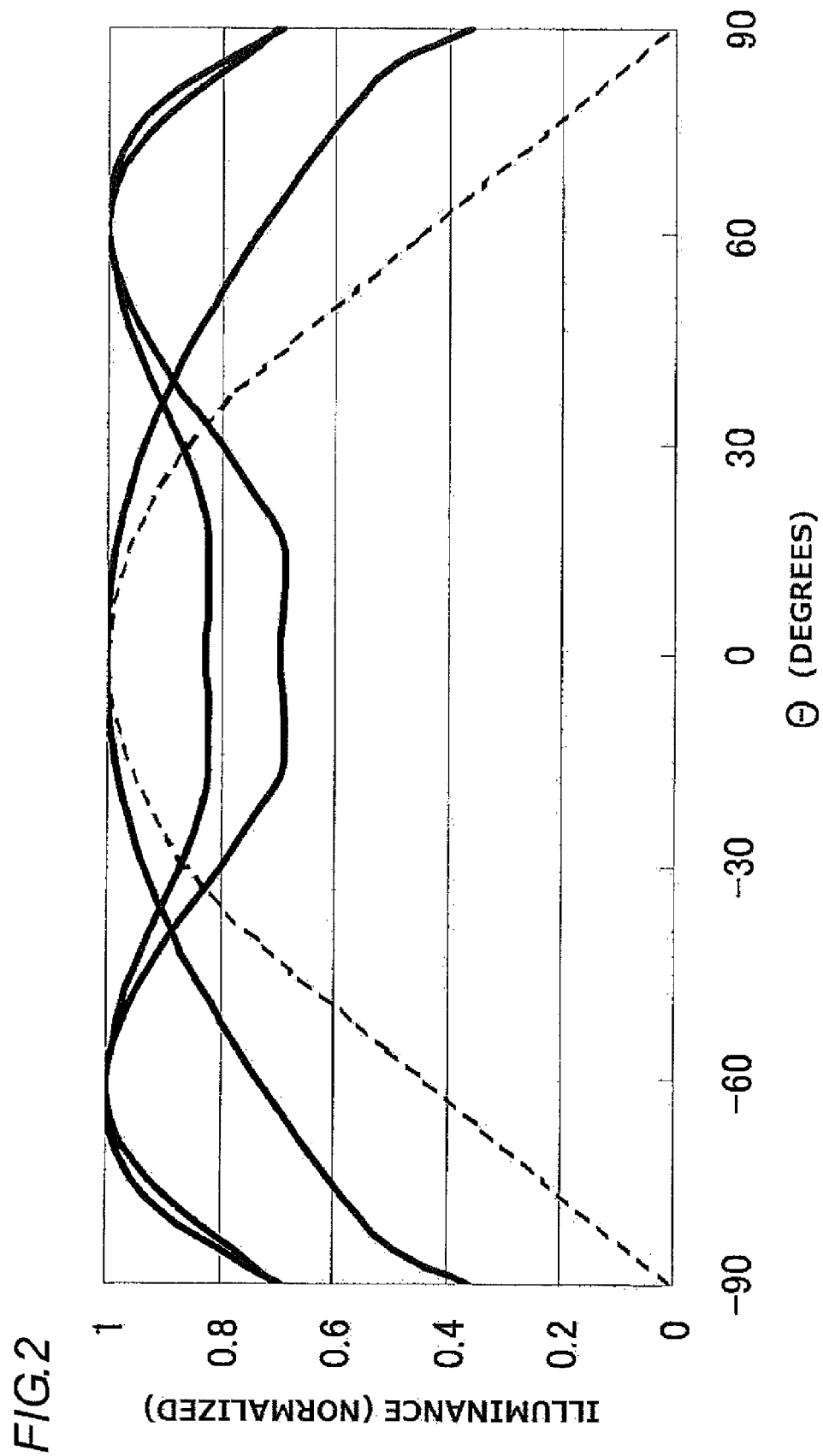
FIG. 2 is a diagram representing illuminance distributions of the semiconductor light-emitting device.

FIG. 2 is a graph representing the results of the examination of index A and changes in illuminance (illuminance distribution) by irradiation angles of the white light emitted by the light-emitting device 1. The horizontal axis represents the angle θ [degrees] made by the optical axis Ax of the semiconductor light-emitting element 3 and a measurement point. The vertical axis represents the illuminance at each measurement point, relative to the highest illuminance 1. The distance between each measurement point and the semiconductor light-emitting element 3 is held constant. In FIG. 2, (a) is the illuminance distribution of a common LED light-emitting element (Reference Example), (b) is the illuminance distribution of the light-emitting device 1 with an index A of 0.6, (c) is the illuminance distribution of the light-emitting device 1 with an index A of 1.0, and (d) is the illuminance distribution of the light-emitting device 1 with an index A of 1.7.

As shown in FIG. 2, (a), the light obtained at 60 degree angle with respect to the LED light-emitting element is only at most half as bright as that obtained directly below the LED light-emitting element (0 degree position) in the common LED light-emitting element (Reference Example). On the other hand, the light-emitting device 1 of the present embodiment with an index A of 0.61 can retain about 70% of the illuminance obtained directly below the semiconductor light-emitting element 3 even at the 60-degree angle position with respect to the semiconductor light-emitting element 3, as shown in FIG. 2, (b).

As demonstrated above, the light-emitting device 1 according to the present embodiment can illuminate a wide range by itself with the molded member 4 satisfying the index $A=H/(s/n)$ of $0.3 \leq A \leq 6$. Further, a lighting fixture of a wide illumination range can be realized with the light-emitting device 1 without necessitating other optical members such as lenses and reflectors, or without greatly increasing the number of such optical members. This makes it possible to inexpensively provide a small lighting fixture. Further, because the white light does not need to travel through additional optical members or to be reflected at such optical members, the white light can illuminate outside without attenuating. This makes it possible to provide a lighting fixture having high light efficiency.

Note that the height of the molded member 4, and the contact area with the substrate 2 described in the present embodiment are merely examples, and the numerical values of these variables are not limited in the present invention. That is, index A may take various different values by varying the height of the molded member 4, and the contact area with the substrate 2.

For example, FIG. 2, (c) and (d) represent the results of illuminance distribution measurements for index A values of 1.0 and 1.7, respectively, obtained by varying only the height H under constant contact area according to the foregoing embodiment.

As indicated by (c) and (d) in FIG. 2, the light-emitting devices 1 with the index A values of 1.0 and 1.7 have the highest illuminance at the 60-degree angle position with respect to the semiconductor light-emitting element 3, and illuminance changes are small in the −60 to +60 degree angle range with respect to the semiconductor light-emitting element 3. The lowest illuminance in the −90 to +90 degree angle range with respect to the semiconductor light-emitting element 3 is about 70% of the highest illuminance obtained in the same range. With the index A of 1.0, illuminance changes are within 80% in the −85 to +85 degree angle range, and the illuminance does not vary greatly over the illumination range as wide as almost to the sides of the semiconductor light-emitting element 3. The molded member 4 is thus preferably formed so as to satisfy the index A of $0.9 \leq A \leq 1.7$.

Index A is set to 0.3 or more. With an index A value below 0.3, the illuminance in the −60 to +60 degree angle range with respect to the semiconductor light-emitting element 3 becomes less than 60% of the illuminance at the 0-degree angle position. It is difficult to illuminate a wide range with uniform illuminance when the index A is less than 0.3.

The upper limit of index A is 6 or less, though it depends on the light transmissivity of the resin forming the light transmitting member. With an index A value above 6, the light from the semiconductor light-emitting element 3, and the white light attenuate as these light components pass through the molded member 4, and the brightness of the light decreases.

The present embodiment has been described through the case where the molded member 4 is a combination of a columnar and a conical shape. However, the present invention is not limited to this example. For example, aside from the combination of a column and a circular cone, the molded member may be formed into a shape of a triangular prism, a quadrangular prism, a polygonal prism, a triangular pyramid, a quadrangular pyramid, or a polygonal pyramid, or a combination of these different shapes. Further, the molded member 4 may be polygonal in shape to obtain the desired light distribution characteristics.

Variations

The foregoing embodiment described an example in which the semiconductor light-emitting element 3 is solely mounted on the substrate 2. However, the present invention is not limited to this example. FIGS. 3 to 6 are perspective views of light-emitting devices according to First to Fourth Variations, respectively, of the present invention.

Figure 3:
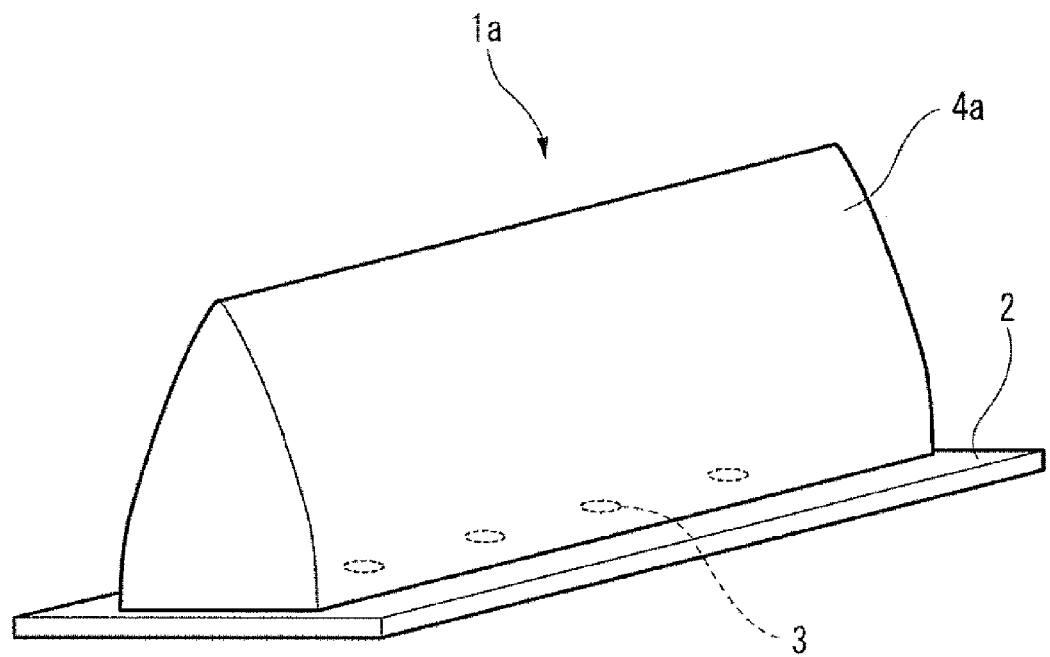
FIG. 3 is a perspective view of a semiconductor light-emitting device according to First Variation of the present invention.

Referring to FIG. 3, the light-emitting device 1*a* of First Variation of the present invention includes a plurality of semiconductor light-emitting elements 3 disposed in a line on the substrate 2, and a single molded member 4*a* covering these semiconductor light-emitting elements 3. The molded member 4*a* has a form of a column that extends in the direction in which the semiconductor light-emitting elements 3 are disposed. The molded member 4*a* has the same cross sectional shape as that shown in FIG. 1A on the cross section taken orthogonal to the direction the semiconductor light-emitting elements 3 are disposed. Index A satisfies $0.3 \leq A \leq 6$. With the molded member 4*a* of this variation that emits light in a columnar fashion, the light-emitting device 1a can illuminate a long region along the substrate 2 with white light of uniform illuminance.

Figure 4:
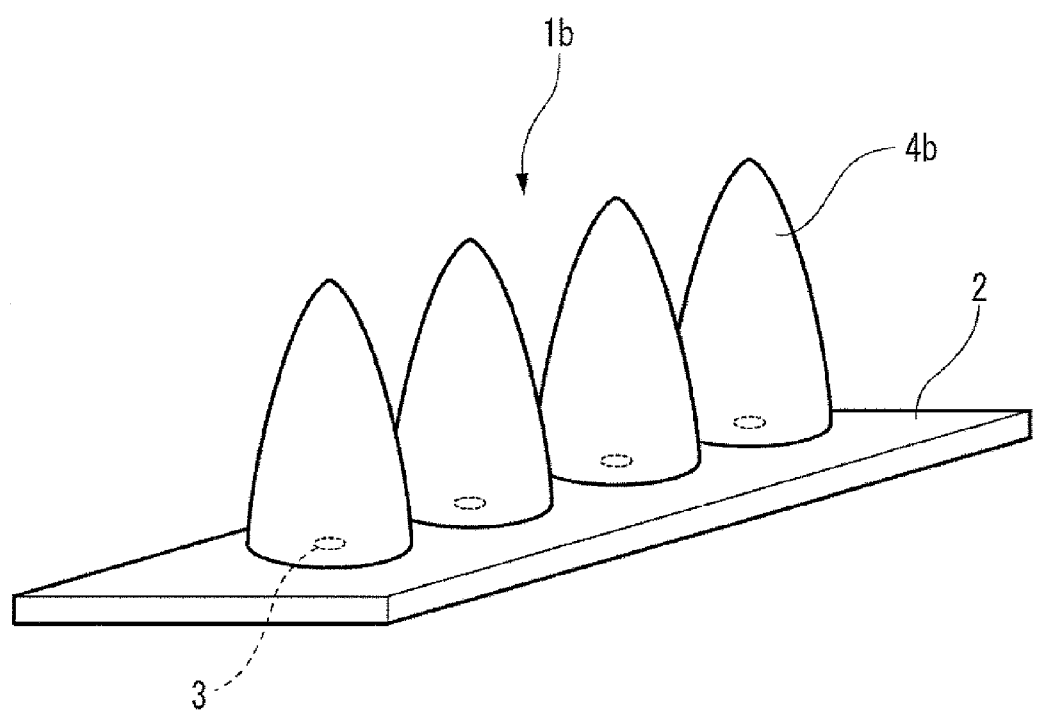
FIG. 4 is a perspective view of a semiconductor light-emitting device according to Second Variation of the present invention.

Referring to FIG. 4, the light-emitting device 1b of Second Variation of the present invention includes a plurality of semiconductor light-emitting elements 3 disposed in a line on the substrate 2, and a plurality of molded members 4b respectively covering the semiconductor light-emitting elements 3. The molded members 4b each have substantially the same shape as the molded member 4 of the embodiment shown in FIG. 1A and FIG. 1B. Index A satisfies 0.3≤A≤6.

The molded members 4b are configured to be continuous at the base portions (portions closer to the substrate 2). Because the molded members 4b are continuous at the base portions, the light-emitting device 1b can emit light also from the regions between the semiconductor light-emitting elements 3, and can give off light as a whole.

Figure 5:
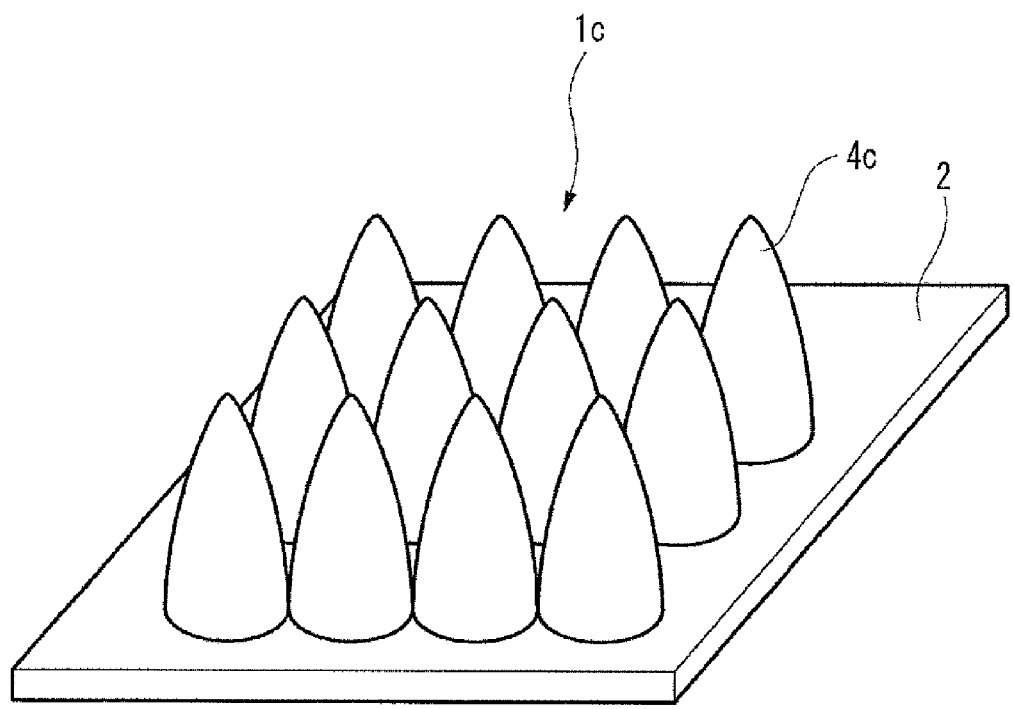
FIG. 5 is a perspective view of a semiconductor light-emitting device according to Third Variation of the present invention.

Referring to FIG. 5, the light-emitting device 1c of Third Variation of the present invention includes a plurality of semiconductor light-emitting elements 3 (not illustrated) mounted on the substrate 2, and a plurality of molded members 4c respectively covering the semiconductor light-emitting elements 3. The molded members 4b each have substantially the same shape as the molded member 4 of the embodiment shown in FIG. 1A and FIG. 13. Index A satisfies 0.3≤A≤6. With the molded members 4c of this variation formed in a planar fashion over the substrate, the light can illuminate even a wider range with uniform illuminance.

The molded members 4c may be configured to be continuous at the base portions (portions closer to the substrate 2) in the same manner as above. When the molded members 4c are continuous at the base portions, the light-emitting device 1c can emit light also from the regions between the semiconductor light-emitting elements 3, and can give off light as a whole.

Figure 6:
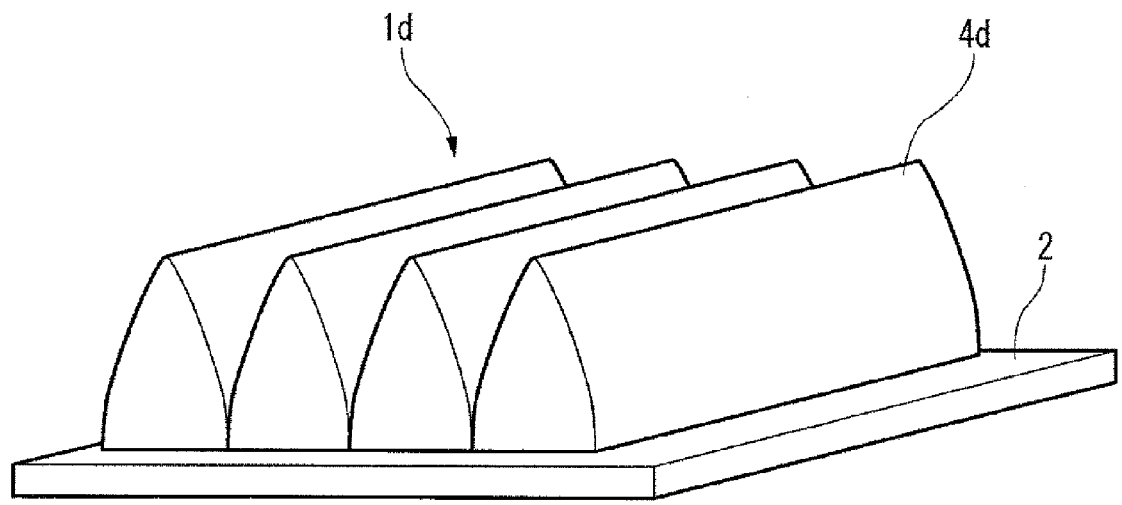
FIG. 6 is a perspective view of a semiconductor light-emitting device according to Fourth Variation of the present invention.

Referring to FIG. 6, the light-emitting device 1d of Fourth Variation of the present invention includes a plurality of semiconductor light-emitting elements 3 (not illustrated) disposed in lines on the substrate 2, and a plurality of molded members 4d respectively covering each line of the semiconductor light-emitting elements 3. The molded members 4d each have a form of a column that extends in the direction in which the semiconductor light-emitting elements 3 are disposed. With the columnar molded members 4d of this variation disposed in lines, the light-emitting device 1c can emit light in a planar fashion, and can illuminate even a wider range with uniform illuminance.

The material of the first phosphor 5 is not limited to the foregoing example, and other materials represented by the general formula $M^1O_2 \cdot a(M^2_{1-z}, M^4_z)O \cdot bM^3X_2$ may be used.

$M^1$ represents at least one element selected from the group consisting of Si, Ge, Ti, Zr, and Sn. $M^2$ represents at least one element selected from the group consisting of Mg, Ca, Sr, Ba, and Zn. $M^3$ represents at least one element selected from the group consisting of Mg, Ca, Sr, Ba, and Zn. X represents at least one halogen element. $M^4$ represents at least one element selected from the group consisting of rare earth elements and Mn, and that requires $Eu^{2+}$.

The symbol a falls within a range of 0.1≤a≤1.3, b falls within a range of 0.1≤b≤0.25, and z falls within a range of 0.03<z<0.8. In the general formula, $M^1$=Si, $M^2$=Ca/Sr (molar ratio 60/40), $M^3$=Sr, X=Cl, $M^4$=$Eu^{2+}$, a=0.9b=0.17, and $M^4$ content c (molar ratio) is c/(a+c)=0.1 in the foregoing embodiment.

The material of the second phosphor 6 is not limited to the material exemplified above, and may be selected from a group of phosphors represented by the following general formula.

$$M^1a(M^2O_4)_bX_c:Re_d \qquad (1)\text{ General Formula}$$

$M^1$ requires at least one of Ca, Sr, and Ba, and may be partially replaced by an element selected from the group consisting of Mg, Zn, Cd, K, Ag, and Tl. $M^2$ requires P, and may be partially replaced by an element selected from the group consisting of V, Si, As, Mn, Co, Cr, Mo, W, and B. X represents at least one halogen element. Re represents at least one rare earth element, or Mn, and requires $Eu^{2+}$.

The symbol a falls within a range of 4.2≤a≤5.8, b falls within a range of 2.5≤b≤3.5, c falls within a range of 0.8<c<1.4, and d falls within a range of 0.01<d<0.1.

$$M^1_{1-a}MgAl_{10}O_{17}:Eu^{2+}, \qquad (2)\text{ General Formula}$$

$M^1$ is at least one element selected from the group consisting of Ca, Sr, Ba, and Zn, and a falls within a range of 0.001≤a≤0.5.

$$M^1_{1-a}MgSi_2O_8:Eu^{2+}_a \qquad (3)\text{ General Formula}$$

$M^1$ is at least one element selected from the group consisting of Ca, Sr, Ba, and Zn, and a falls within a range of 0.001≤a≤0.8.

$$M^1_{2-a}(B_5O_9)X:Re_a \qquad (4)\text{ General Formula}$$

$M^1$ is at least one element selected from the group consisting of Ca, Sr, Ba, and Zn, X is at least one halogen element, and a falls within a range of 0.001≤a≤0.5.

In the foregoing embodiments, the semiconductor light-emitting element 3 is used that emits light invisible to human eye, and the light from the semiconductor light-emitting element 3 is converted into blue light and yellow light with the first phosphor 5 and the second phosphor 6 to produce externally emitted white light. However, the present invention is not limited to this example. For example, the semiconductor light-emitting element may be one that emits blue light. In this case, the phosphors contained in the molded member absorb the blue light, and emit red, green, yellow, and orange colors. It is desirable in this case to contain large amounts of a light diffusing agent in the molded member to actively diffuse the highly directional light emitted by the semiconductor light-emitting element.

This application is based on Japanese Patent Application Number 2012-023177 filed Feb. 6, 2012, the contents of which are hereby incorporated by reference.

REFERENCE SIGNS LIST

1: Light-emitting device (semiconductor light-emitting device)
2: Substrate
3: Semiconductor light-emitting element
4: Molded member
5: First phosphor (phosphor)
6: Second phosphor (phosphor)
7: Binder
8: Electrode

The invention claimed is:
1. A semiconductor light-emitting device comprising:
a substrate;
one or more semiconductor light-emitting elements provided on the substrate, and that emit light having a peak wavelength in a 380 nm to 480 nm wavelength region; and a molded member covering the semiconductor light-emitting element, and containing a phosphor that emits visible light by being excited by the emitted light from the semiconductor light-emitting element, wherein the molded member is formed so that index A=H/(s/n) satisfies $0.3 \leq A \leq 6$, where H is the height [mm] of the molded member from the substrate, s is the square root [mm] of the contact area between the substrate and the molded member, and n is the number of the semiconductor light-emitting elements covered with the molded member, wherein a plurality of the semiconductor light-emitting elements are disposed in a plurality of lines on the substrate, wherein a plurality of the molded members are disposed, each of which respectively covers each of the plurality of lines, and wherein each of the plurality of the molded members respectively is formed in a column shape that extends in a direction along the plurality of lines.

2. The semiconductor light-emitting device according to claim 1, wherein the molded member is formed into a shape that is largest along the thickness in a main emission direction of the semiconductor light-emitting element.

3. The semiconductor light-emitting device according to claim 1, wherein more than one of the semiconductor light-emitting elements is disposed on the substrate, and wherein the molded member is integrally provided so as to be continuous between the semiconductor light-emitting elements.

4. The semiconductor light-emitting device according to claim 1, wherein the molded member is formed so as to satisfy the index A of $0.9 \leq A \leq 1.7$.

5. The semiconductor light-emitting device according to claim 1, wherein the volume concentration of the phosphor contained in the molded member is 0.005 vol % to 10 vol %.

6. The semiconductor light-emitting device according to claim 2, wherein more than one of the semiconductor light-emitting elements is disposed on the substrate, and wherein the molded member is integrally provided so as to be continuous between the semiconductor light-emitting elements.

7. The semiconductor light-emitting device according to claim 2, wherein the molded member is formed so as to satisfy the index A of $0.9 \leq A \leq 1.7$.

8. The semiconductor light-emitting device according to claim 3, wherein the molded member is formed so as to satisfy the index A of $0.9 \leq A \leq 1.7$.

9. The semiconductor light-emitting device according to claim 6, wherein the molded member is formed so as to satisfy the index A of $0.9 \leq A \leq 1.7$.

10. The semiconductor light-emitting device according to claim 2, wherein the volume concentration of the phosphor contained in the molded member is 0.005 vol % to 10 vol %.

11. The semiconductor light-emitting device according to claim 3, wherein the volume concentration of the phosphor contained in the molded member is 0.005 vol % to 10 vol %.

12. The semiconductor light-emitting device according to claim 4, wherein the volume concentration of the phosphor contained in the molded member is 0.005 vol % to 10 vol %.

13. The semiconductor light-emitting device according to claim 6, wherein the volume concentration of the phosphor contained in the molded member is 0.005 vol % to 10 vol %.

14. The semiconductor light-emitting device according to claim 7, wherein the volume concentration of the phosphor contained in the molded member is 0.005 vol % to 10 vol %.

15. The semiconductor light-emitting device according to claim 8, wherein the volume concentration of the phosphor contained in the molded member is 0.005 vol % to 10 vol %.

16. The semiconductor light-emitting device according to claim 9, wherein the volume concentration of the phosphor contained in the molded member is 0.005 vol % to 10 vol %.

17. The semiconductor light-emitting device according to claim 1, wherein at least part of the molded member is formed in a shape of a circular cone or a shape of a polygonal pyramid.

* * * * *